United States Patent [19]
Jung

[11] Patent Number: 6,160,415
[45] Date of Patent: Dec. 12, 2000

[54] APPARATUS AND METHOD FOR SETTING ZERO POINT OF Z-AXIS IN A WAFER PROBE STATION

[75] Inventor: Do-Kwon Jung, Kyunggi-do, Rep. of Korea

[73] Assignee: Samsung Electronics Co., Ltd., Suwon, Rep. of Korea

[21] Appl. No.: 09/188,899

[22] Filed: Nov. 10, 1998

[30] Foreign Application Priority Data

Nov. 11, 1997 [KR] Rep. of Korea ............... 97-59259

[51] Int. Cl.[7] .................................................. G01R 31/02
[52] U.S. Cl. ........................ 324/765; 324/754; 324/758; 324/158.1
[58] Field of Search .................... 324/765, 757, 324/758, 754, 158.1, 750; 364/559; 348/86

[56] References Cited

U.S. PATENT DOCUMENTS

| | | | |
|---|---|---|---|
| 3,585,480 | 6/1971 | Kirkpatrick | 318/603 |
| 5,539,676 | 7/1996 | Yamaguchi | 324/758 X |
| 5,642,056 | 6/1997 | Nakajima et al. | 324/758 |
| 5,691,764 | 11/1997 | Takeoshi et al. | 348/86 |
| 5,945,239 | 8/1999 | Taniguchi | 430/30 |
| 6,043,668 | 3/2000 | Carney | 324/758 |

*Primary Examiner*—Safet Metjahic
*Assistant Examiner*—T. R. Sundaram
*Attorney, Agent, or Firm*—Jones Volentine, L.L.C.

[57] ABSTRACT

An apparatus and method for setting zero point of Z-axis in a semiconductor wafer probe station are disclosed. The device includes a base with flat bottom surface; a circuit tester mounted in top portion of the base; and first and second conductive parts attached at either sides of the base, in which two probe leads of the tester are connected therewith, and the first and second conductive parts extending over a bottom portion of the base and being electrically separated on the bottom portion of the base, wherein, when the device is placed on a wafer chuck top area, the first conductive part covers vacuum pins provided in the chuck top and the second conductive part excludes any of the vacuum pins. An output of the circuit tester indicates if the pins and the wafer chuck are level. The method includes initializing the probe station to reset X/Y-axis thereof; positioning a level check device including a circuit tester on the wafer chuck to allow a first conductive part of the level check device to be in contact with vacuum pins of the wafer chuck and a second conductive part of the level check device, electrically separated from the first conductive part, not in contact with any vacuum pins of the wafer chuck; and raising the wafer chuck until the circuit tester indicates the wafer chuck is level with the vacuum pins. The apparatus and method minimize measuring errors in leveling the chuck top with the vacuum pins and reduce setting time.

20 Claims, 7 Drawing Sheets

Fig. 6A
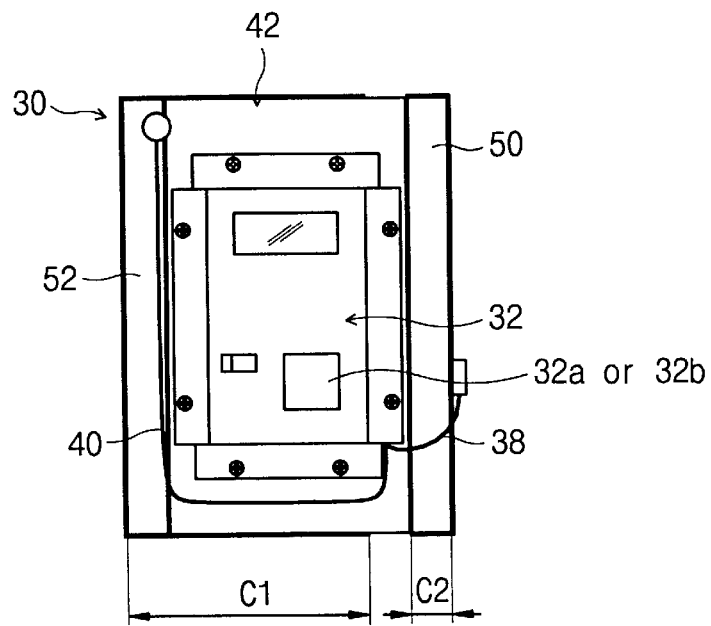
Fig. 6B
Fig. 6C
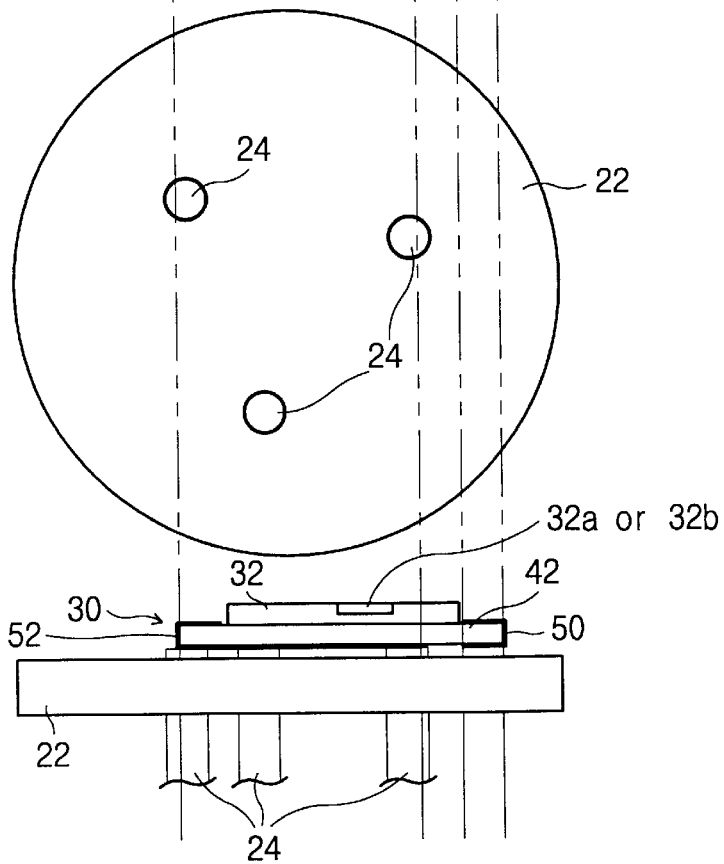

APPARATUS AND METHOD FOR SETTING ZERO POINT OF Z-AXIS IN A WAFER PROBE STATION

CROSS-REFERENCE TO RELATED APPLICATIONS

The present application claims priority under 35 U.S.C. § 119 to Korean Patent Application No. 97-59259 filed on Nov. 11, 1997, the entire contents of which are hereby incorporated by reference.

BACKGROUND OF THE INVENTION

1. Field of the Invention

The present invention relates to a semiconductor wafer test equipment, and more particularly to an apparatus and method for setting zero point of Z-axis in a semiconductor wafer probe station.

2. Description of Related Art

At the end of a semiconductor fabrication process, a wafer test process is normally performed in order to sort good and bad or failed chips of the wafer by testing the electrical characteristics of each chip or die. Such a wafer test process is also called "Electrical Die Sorting (EDS)" and is carried out by test equipment including a tester and a probe station. The tester electrically determines the good and bad chips, and the probe station allows the wafer to move to the preset position for the test of each chip of the wafer.

Conventional wafer test equipment is illustrated in FIG. 1. The test equipment 10 includes a tester head 12, a performance board 16, and a probe card 18. The probe card 18 has probe needles or tips 19 to be in contact with the pad of chips of a wafer 20. The wafer 20 is loaded in top portion of a wafer chuck 22 of a probe station. The probe station enables the wafer chuck 22 to move in X/Y-axis direction at intervals of chip size and subsequently to move in Z-axis direction to contact the probe card tips 19 of the tester. Further, the wafer chuck 22 has vacuum pins 24, shown in FIG. 2, which hold the wafer 20 during the test process. The tester head 12 receives electrical signals from a tester system and supplies it to the probe card 18 via the performance board 16. The test signals are applied to a semiconductor device of each chip through the probe tips 19, thereby finding out if the device is operational. The above test operation is carried out by a test program.

Referring to FIG. 2, there is shown a top surface of the chuck 22 in which three vacuum pins 24 are provided through holes of the chuck top. The wafer is placed on a top portion of the vacuum pins 24. The vacuum pins 24 are arranged to move up and down along with Z-axis direction movement of the wafer chuck 22. Also, the vacuum pins 24 are connected with a vacuum line (not shown) to hold the wafer by a vacuum force during the wafer test process.

In the probe station, it is essential that the wafer chuck 22 should move precisely in the X/Y/Z-axis directions to perform the test operation. In particular, the Z-axis movement of the probe station is most important since it determines the contact face between the pad of the chip and the probe tips 19 of the tester. To initialize the probe station, the reset points (zero points) for the X/Y-axis direction movement have been set, while the zero point for the Z-axis is variable.

In order to set the zero point for the Z-axis movement, the top surface of the wafer chuck 22 moving upwardly along the Z-axis is arranged to be level with the top of the vacuum pins 24, and then the vacuum pins 24 are leveled up at a predetermined height above the chuck top. The height depends on the specification of a probe system and is set to, for example, 180 mils. Those two step adjustment operations are illustrated in FIG. 3A and 3B.

Therefore, adjustment of the zero point for the z-axis totally depends on leveling the chuck top with the vacuum pins. The leveling has been performed manually by the naked eye or the finger touch, with the result that an error is occurring at every adjustment. It has been found that the error covers minimum 3 mils and maximum 5 mils. A dial gauge or block gauge may be used to level the chuck top with the vacuum pins. However, it is difficult to use such a gauge in the wafer chuck top area. Furthermore, the measuring process is tedious and time-consuming.

SUMMARY OF THE INVENTION

The present invention is therefore directed to an apparatus and method for setting zero point of Z-axis in a semiconductor wafer probe station which substantially overcomes one or more of the problems due to the limitations and disadvantages of the related art. In particular, the present invention is directed to an apparatus and method for setting zero point of Z-axis in a semiconductor wafer probe station which can minimize measuring errors in leveling the chuck top with the vacuum pins and reduce setting time.

The above and other objects may be realized by providing a device including a base with a flat bottom surface; a circuit tester mounted in top portion of the base; and first and second conductive parts attached at either side of the base, in which two probe leads of the tester are connected therewith, the first and second conductive parts extending over part of a bottom portion of the base and being electrically separated from one another in the bottom portion, wherein, when the device is placed on a wafer chuck top area, the first conductive part on the bottom portion of the base covers vacuum pins provided in the chuck top and the second conductive part on the bottom of the base excludes any of the vacuum pins.

Preferably, the circuit tester includes a digital volt meter (DVM) set in a resistance measuring mode. The circuit tester may include an analog ohm meter. The circuit tester may include a series connection of a light bulb, a battery, and a power switch with both circuit ends connected to the first conductive part and the second conductive part. An output, e.g., a display window which indicates when no resistance is detected by the circuit tester may be included. A groove may be provided in a center of the base for receiving the tester.

Preferably, the base is made of transparent material, e.g., an acrylic resin. Preferably, the first conductive part covers more than half of the bottom portion of the base. The first conductive part and the second conductive part may be made of sheet metal and an adhesive may be applied to one surface of each of the conductive parts.

These and other objects may also be realized by providing a method for setting a zero point of a Z-axis in a wafer probe station including: initializing the probe station to reset X/Y-axis thereof; positioning a level check device including a circuit tester on the wafer chuck to allow a first conductive part of the level check device to be in contact with vacuum pins of the wafer chuck and a second conductive part of the level check device, electrically separated from the first conductive part, not to be in contact with any of the vacuum pins of the wafer chuck; and raising the wafer chuck until the circuit tester indicates the wafer chuck is level with the vacuum pins.

After the circuit tester indicates the wafer chuck is level with the vacuum pins, the vacuum pins may be raised to a predetermined height, e.g., 180 mils. After the raising of the pins, the zero point of a zero sensor for the Z-axis movement may be set.

The indication by the circuit tester may include outputting a null resistance value. The outputting may include displaying a null resistance value.

A power switch of the circuit tester may be activated and the tester may be set to a resistance measuring range.

The raising of the wafer chuck includes stepwise moving which may occur at intervals of 0.25 mils to 0.5 mils.

With this invention, an effective tool for setting zero point of Z-axis in the wafer probe station in an easy and precise manner is realized. The zero point setting time can be considerably reduced since the block gauge or dial gauge is not required for setting the zero point of Z-axis.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

This invention may be understood and its object and advantages will become apparent to those skilled in the art by reference to the accompanying drawings as follows:

FIG. 6A is a side view of the level checker;

FIG. 6B is a top view of the wafer chuck with vacuum pins;

FIG. 6C is a side view of the wafer chuck in position with the level checker, FIGS. 6A–6C showing positioning of the level checker in the chuck top area in accordance with principle of the invention;

DETAILED DESCRIPTION OF PREFERRED EMBODIMENTS

Figure 1:
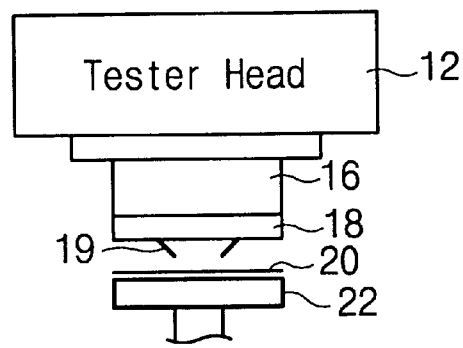
FIG. 1 is an illustration of a conventional wafer test equipment, showing a part of tester and probe station.
Figure 2:
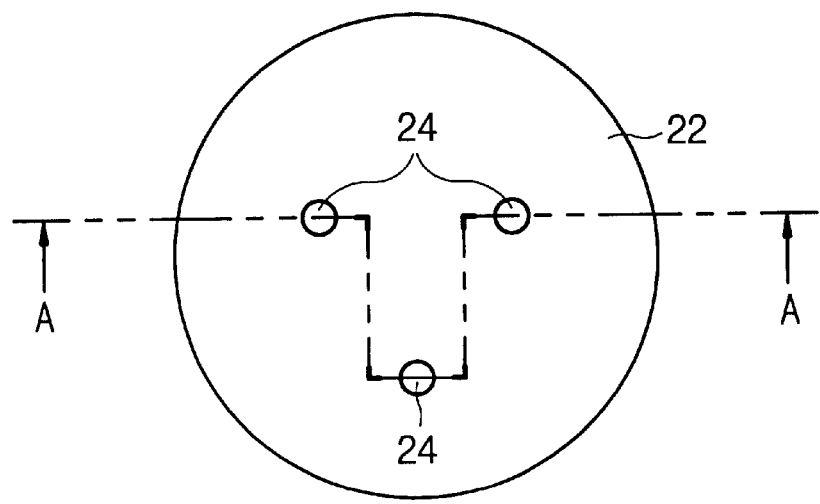
FIG. 2 is a top view of a wafer chuck for showing vacuum pins provided in the chuck top.
Figure 3A:
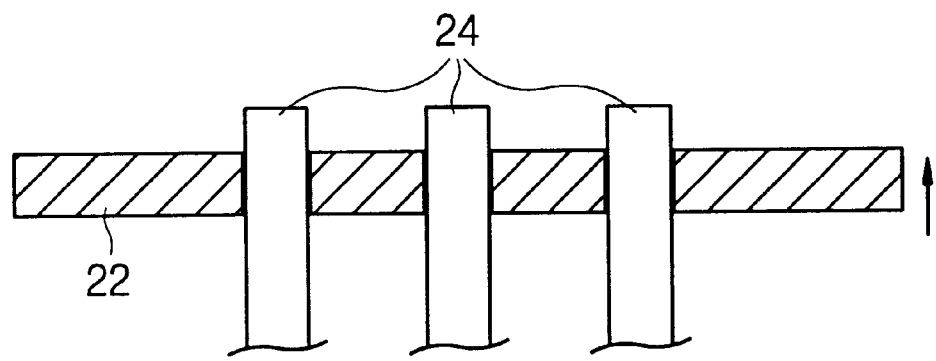
FIG. 3A and 3B are sectional views each taken from line A–A' of FIG. 2, showing leveling of the chuck top with vacuum pins along the Z-axis of the probe station.
Figure 3B:
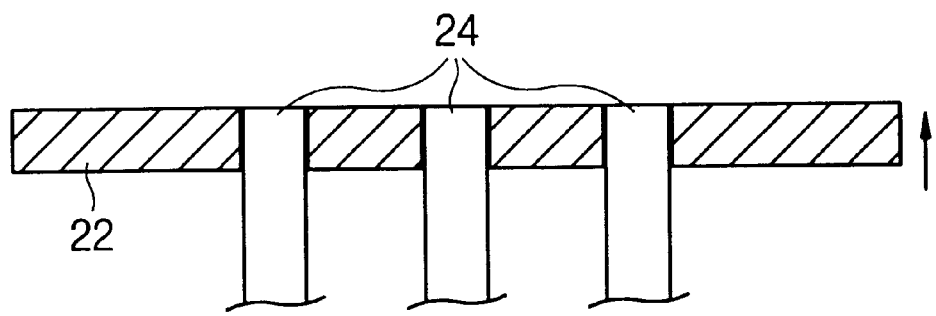
Figure 4:
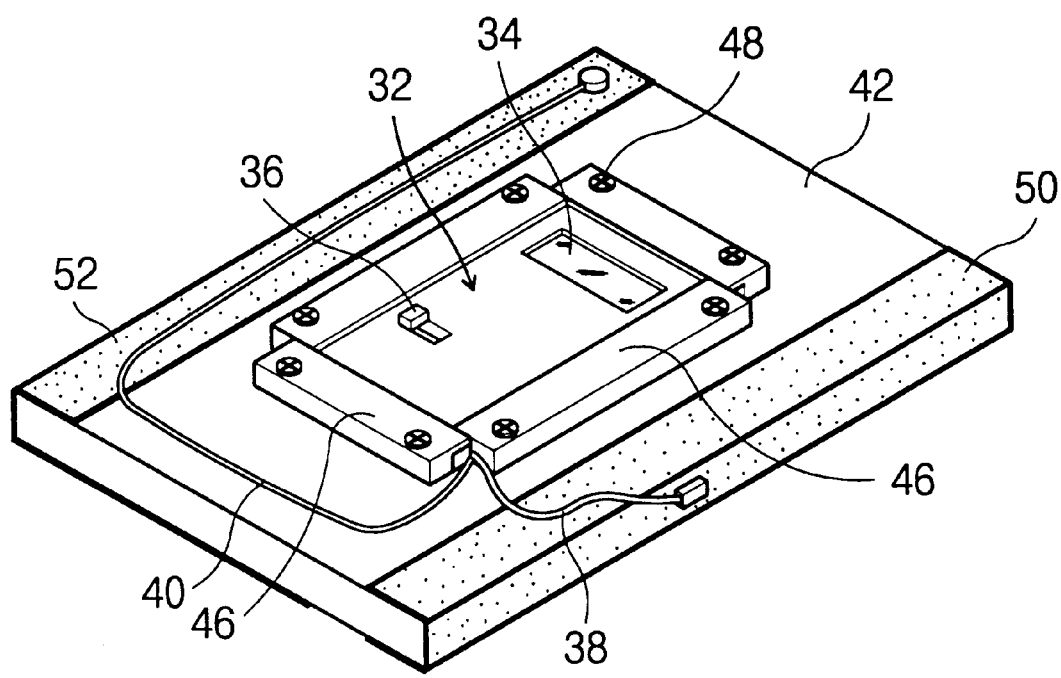
FIG. 4 is an isometric view of a level checker for use in setting the zero point of Z-axis in a semiconductor wafer probe station in accordance with the present invention.

Referring to FIG. 4, a level checker for use in setting the zero point of Z-axis in a semiconductor wafer probe station in accordance with the present invention is shown. The level checker of this invention is to be placed on the chuck top of the probe station when the Z-axis initial position setting is required. The level checker 30 includes a base 42, a circuit tester 32 mounted in the base 42, and first and second conductive parts 50 and 52 formed at either side of the base 42. The base 42 is preferably made of transparent material such as acrylic resins and formed into rectangle shape board with flat top and bottom surfaces. The circuit tester 32 is mounted with a plurality of support bars 46 and screws 48 on the top surface of the base 42. Two probe leads 38 and 40 of the tester 32 are connected with the first conductive part 50 and the second conductive part 52, respectively. The configuration in FIG. 4 also includes a display window 34 and a power on/off switch 36 of the circuit tester 32.

Figure 5:
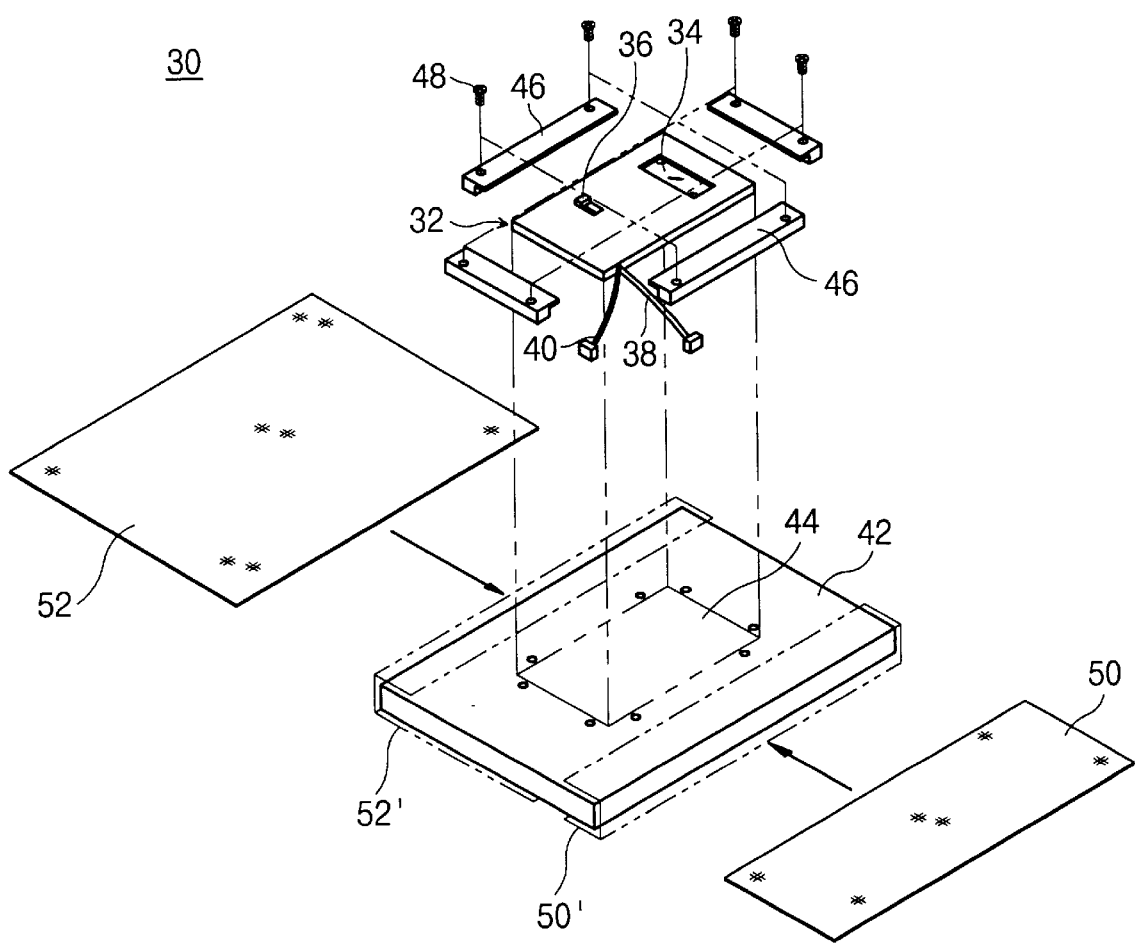
FIG. 5 is an exploded perspective view of the level checker of FIG. 4.

As shown in detail in FIG. 5, the first conductive part 50 and second conductive part 52 are rectangles of different sizes and are preferably made of conductive material such as sheet metal or copper plate. The first conductive plate 50 and the second conductive plate 52 are bent to be separately attached to the bottom portion of the base 42, with one of the conductive plates covering most of the bottom portion of the base 42. In this embodiment, bent portion 52' of the second conductive plate 52 covers the greater part, i.e., more than half, of the bottom portion of the base 42. The bent portion 50' of the first conductive plate 50 covers the right side part of the bottom portion. As a result, the bent portion 50' and 52' of the first conductive plate 50 and the second conductive plate 52 are electrically separated in the bottom portion of the base 42. Preferably, the first conductive plate 50 and the second conductive plate 52 are attached to the base 42 using adhesive. Further, at the center portion 44 of the top surface of the base 42, the circuit tester 32 is mounted by the aid of four supporting bars 46 and screws 48. The center portion 44 of the base 42 may include a groove for easy installation of the circuit tester 32.

The circuit tester 32 may be of any conventional one that can probe short or open of a circuit. The tester 32 used in this embodiment adopts a common digital volt meter (DVM) set to the resistance measuring range, however, other simple circuit test equipment such as an analog ohm meter 32a can be used in this invention. Further, while a display window is illustrated, any type of output, e.g., audible or visible, may be employed to indicate that the circuit tester has determined that the wafer chuck is level with the vacuum pins. For example, a small light bulb circuit tester 32b including a series connection of a light bulb, a battery, and a power switch with both circuit ends connected to the first conductive plate 50 and the second conductive plate 52 may be used in this invention. When the circuit tester determines the wafer and the pins are level, the light bulb will be turned on.

FIGS. 6A–6C illustrate the principle of positioning the level checker 30 onto the chuck top 22 in accordance with the invention. Calling the bottom portion of the level checker 30 corresponding to the bent portion 52' of the second conductive plate 52 a first contact region C1 and the bottom portion corresponding to the bent portion 50' of the first conductive plate 50 a second contact region C2, the first contact region C1 is located in the chuck top area to cover the three vacuum pins 24 and the second contact region C2 is located in the chuck top area to exclude any of the vacuum pins 24. This labeling is shown in the top view of the checker 30 in FIG. 6A. The top view of the wafer chuck 22 in FIG. 6B illustrates the relationship between the pins 24 of the chuck 22 and the contact regions C1, C2. A side view of the positioned level checker 30 is illustrated in FIG. 6C. The positioning of the level checker 30 can be carried out manually by eying the vacuum pins 24 through the transparent base 42.

As similar to the related probe station, the wafer chuck 22 shown in FIG. 6B is made of conductive material and has three vacuum pins 24 provided about the center portion thereof. The vacuum pins 24 are arranged to move up and down along the Z-axis ofthe probe station. Further, the vacuum pins 24 are connected with a vacuum line (not shown) to hold the wafer by a vacuum force during the wafer test process. During initialization, the vacuum pins 24 are raised upwardly together with the wafer chuck 22 and maintain some position above the chuck top in order to perform zero point setting operation for the Z-axis movement of the wafer chuck 22. As previously mentioned, the Z-axis zero point setting operation is performed such that the top surface of the wafer chuck 22 is arranged on a level with the top of the vacuum pins 24, and then the vacuum pins 24 are raised a predetermined height above the chuck top. The height depends on the specification of a probe system and is set to, for example, 180 mils.

Figure 7A:
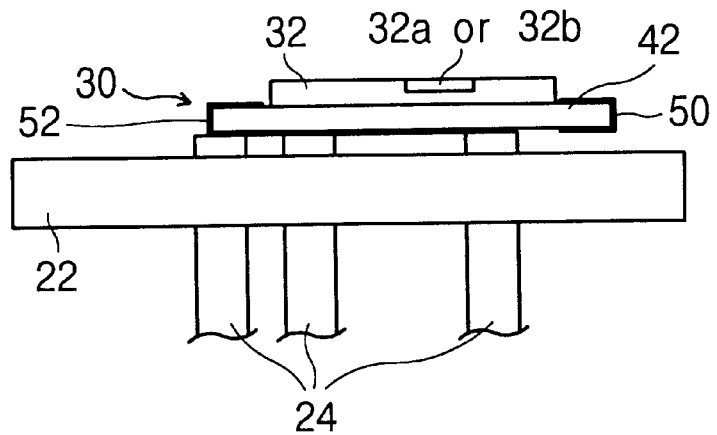
FIG. 7A and 7B are front views of the wafer chuck showing process of leveling of the chuck top with the vacuum pins by using the level checker of the present invention.

Thus, in accordance with the invention, the leveling of the wafer chuck 22 with the top of the vacuum pins 24 is carried out by the level checker 30. The level checker 30 is placed on a top portion of the vacuum pins 24 such that the first contact region C1 of the level checker 30, i.e., the bottom portion 52' of the second conductive plate 52, is in contact with three vacuum pins 24, as shown in FIG. 7A. In this position, the second contact region C2 of the level checker 30, that is the bottom portion 50' of the first conductive plate 50, will not be in contact with any of the vacuum pins 24 or with a portion of the chuck top 22.

Figure 7B:
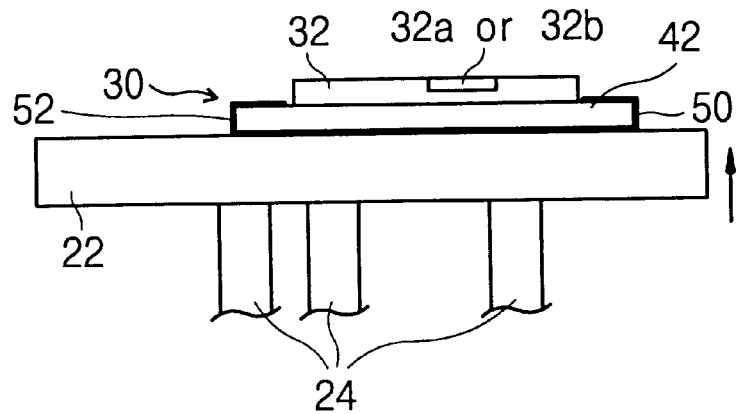

Then the wafer chuck 22 is raised stepwise, preferably at intervals of 0.25 mils to 0.5 mils. When the chuck 22 is leveled with the top of the vacuum pins 24, as shown in FIG. 7B, both the first and second contact regions C1 and C2 of the level checker 30 come in contact with the top surface ofthe chuck 22, which results in electrical connection ofthe first contact region C1 with the second contact region C2. Electrical connection ofthe first contact region C1 with the second contact region C2 allows the circuit tester 32 of the level checker 30 to indicate that the resistance value is null, if the tester 32 is on and set to the resistance measuring range. Thus, when the chuck 22 is raised stepwise to become level with the vacuum pins 24, the operator can find the exact leveling point by observing an output of the circuit tester 32.

Upon completion of leveling of the chuck top 22 with the vacuum pins 24, the level checker 30 may be removed from the chuck 22. Then, the vacuum pins 24 are raised to the predetermined height above the chuck top. With this, the zero point for the Z-axis of the probe station can be set in a precise manner.

Figure 8:
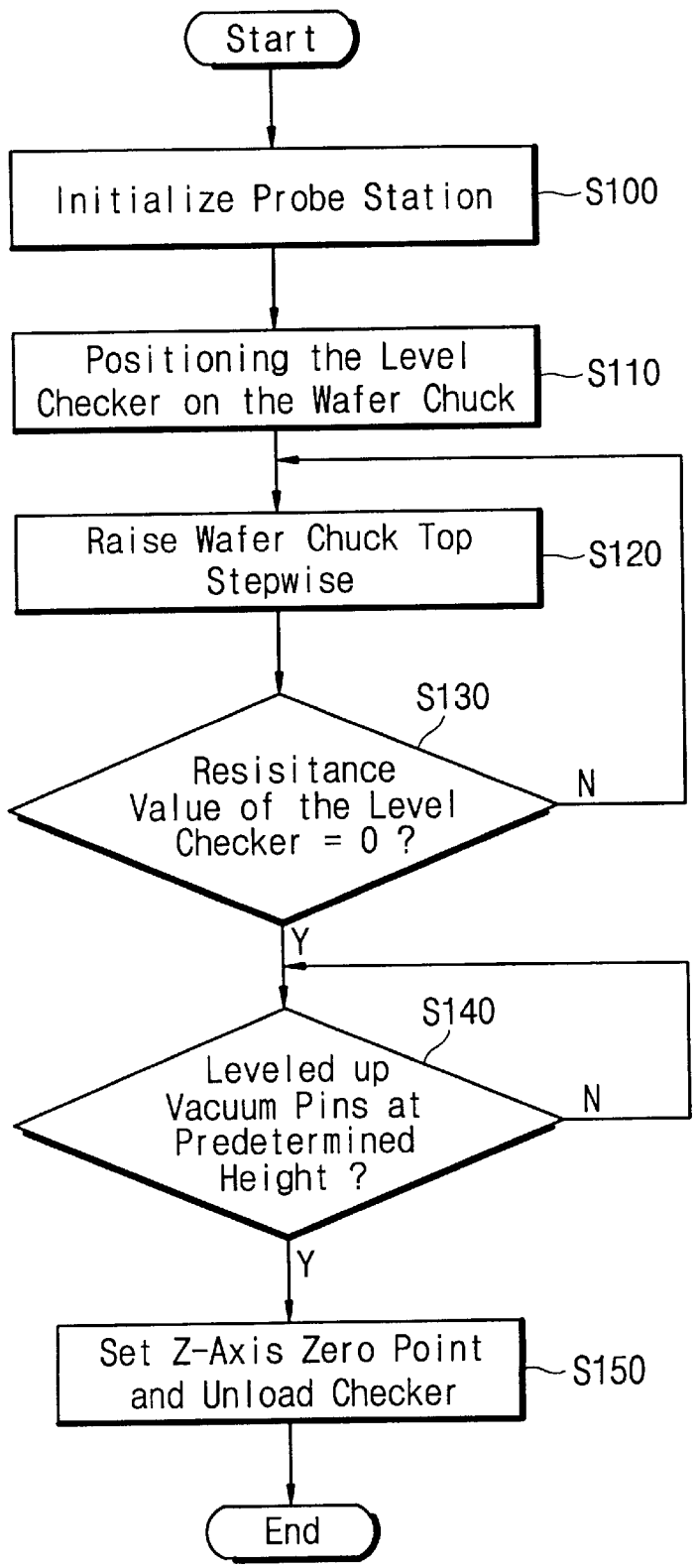
FIG. 8 is a flow diagram depicting a Z-axis zero point setting method using the level checker in accordance with the present invention.

FIG. 8 illustrates the Z-axis zero point setting operation by using the level checker in accordance with the present invention. First, at step 100, initialization of the probe station is performed to reset X/Y-axis thereof. The zero points for the X/Y-axis are automatically set by this procedure. Then, at step 110, positioning of the level checker 30 on the wafer chuck 22 is performed manually to allow the first contact region C1 of the level checker 30, i.e., the bottom portion 52' of the second conductive plate 52, to be in contact with the three vacuum pins 24. At the time of positioning the level checker 30, the power switch 36 of the circuit tester 32 installed in the level checker 30 is switched on to start a resistance measuring operation.

At a next step 120, the chuck top 22 is raised stepwise until the chuck 22 is leveled with the top of the vacuum pins 24. The chuck top 22 is raised, for example, at intervals of 0.25 mils to 0.5 mils. During the raising of the chuck top, at step 130, an output, e.g., the display 34, is monitored to determine when a null resistance value is output. The output of the null resistance value represents that both the first and second contact regions C1 and C2 of the level checker 30 are in contact with the chuck top 22 of conductive material, resulting in electrical connection between the first contact region C1 and the second contact region C2.

Upon finding of the leveling point between the chuck top 22 and the vacuum pins 24, the vacuum pins 24 are raised to allow the top of the vacuum pins 24 to be located at a predetermined height, for example 180 mils, above the chuck top surface. If the pins are not to be raised above the chuck top surface, the method can proceed directly to step 150. Otherwise, step 140 determines whether the vacuum pins 24 are located at the predetermined height. If the vacuum pins 24 are at the predetermined height, a zero sensor (not shown) for the Z-axis is set, thereby setting zero point of Z-axis of the probe station. If not, the vacuum pins 24 are raised again. After completion of the leveling or the zero point setting procedure, the level checker 30 is removed from the chuck top area at step 150 to perform a subsequent wafer test process. In the wafer test process, a wafer to be tested is placed on the vacuum pins 24 which have been set above the chuck top surface.

As apparent from foregoing description, the level checker of the invention provides an effective apparatus and method for setting a zero point of the Z-axis in the wafer probe station in an easy and precise manner. Further, the zero point setting time can be considerably reduced since a block gauge or a dial gauge is not required for setting the zero point of Z-axis.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

What is claimed is:

1. A device for setting a zero point of a Z-axis in a wafer probe station, comprising:

a base with a flat bottom surface;

a circuit tester mounted in top portion of the base; and first and second conductive parts attached at either side of the base, in which two probe leads of the tester are connected therewith, the first and second conductive parts extending over part of the bottom surface of the base and being electrically separated from one another in the bottom surface, wherein, when the device is placed on a wafer chuck top area, the first conductive part on the bottom surface of the base covers vacuum pins provided in the chuck top and the second conductive part on the bottom surface of the base excludes any of the vacuum pins.

2. The device of claim 1, wherein the circuit tester includes a digital volt meter (DVM) set in a resistance measuring mode.

3. The device of claim 1, wherein the base is made of transparent material.

4. The device of claim 3, wherein the transparent material is an acrylic resin.

5. The device of claim 1, wherein the first conductive part covers more than half of the bottom surface of the base.

6. The device of claim 1, wherein the first conductive part and the second conductive part are made of sheet metal and further comprising an adhesive applied to one surface of each of the conductive parts.

7. The device of claim 1, wherein the circuit tester includes an analog ohm meter.

8. The device of claim 1, wherein the circuit tester includes a light bulb circuit tester comprising a series connection of a light bulb, a battery, and a power switch with both circuit ends connected to the first conductive part and the second conductive part.

9. The device of claim 1, further comprising an output which indicates when no resistance is detected by the circuit tester.

10. The device of claim 9, wherein the output includes a display window.

11. The device of claim 1, further comprising a groove in a center of the base for receiving the tester.

12. A method for setting a zero point of a Z-axis in a wafer probe station comprising:

initializing the probe station to reset X/Y-axis thereof;

positioning a level check device including a circuit tester on the wafer chuck to allow a first conductive part of the level check device to be in contact with vacuum pins of the wafer chuck and a second conductive part of the level check device, electrically isolated from the first conductive part, not to be in contact with any of the vacuum pins of the wafer chuck; and raising the wafer chuck until the circuit tester indicates the wafer chuck is level with the vacuum pins.

13. The method of claim 12, further comprising, after the circuit tester indicates the wafer chuck is level with the vacuum pins, raising the vacuum pins to a predetermined height.

14. The method of claim 12, wherein indication by the circuit tester includes outputting a null resistance value.

15. The method of claim 14, wherein said outputting includes displaying a null resistance value.

16. The method of claim 13, further comprising, after the raising of the pins, setting the zero point of a zero sensor for the Z-axis movement.

17. The method of claim 12, further comprising turning on the circuit tester and setting the tester to a resistance measuring range.

18. The method of claim 12, wherein the raising of the wafer chuck includes stepwise moving.

19. The method of claim 18, wherein the stepwise moving occurs at intervals of 0.25 mils to 0.5 mils.

20. The method of claim 13, wherein the predetermined height is 180 mils.

* * * * *